(12) United States Patent
Kuo et al.

(10) Patent No.: US 8,658,528 B2
(45) Date of Patent: Feb. 25, 2014

(54) BUMPING PROCESS AND STRUCTURE THEREOF

(71) Applicant: Chipbond Technology Corporation, Hsinchu (TW)

(72) Inventors: Chih-Ming Kuo, Hsinchu County (TW); Yie-Chuan Chiu, Hsinchu (TW); Lung-Hua Ho, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/753,936

(22) Filed: Jan. 30, 2013

(65) Prior Publication Data
US 2013/0196498 A1     Aug. 1, 2013

Related U.S. Application Data

(62) Division of application No. 13/363,479, filed on Feb. 1, 2012.

(51) Int. Cl.
*H01L 21/44*     (2006.01)

(52) U.S. Cl.
USPC ........... 438/612; 438/613; 438/614; 257/737; 257/738

(58) Field of Classification Search
USPC .................. 438/612–614; 257/737–738, 770, 257/E23.021
See application file for complete search history.

(56) References Cited

U.S. PATENT DOCUMENTS 6,630,736 B1 *  10/2003  Ignaut ........................... 257/737
7,728,442 B2 *   6/2010  Yoshioka et al. ............. 257/780

* cited by examiner

*Primary Examiner* — Theresa T Doan
(74) *Attorney, Agent, or Firm* — Jackson IPG PLLC

(57) ABSTRACT

A bumping process includes providing a silicon substrate; forming a titanium-containing metal layer on silicon substrate, the titanium-containing metal layer comprises a plurality of first areas and a plurality of second areas; forming a first photoresist layer on titanium-containing metal layer; patterning the first photoresist layer to form a plurality of first opening slots; forming a plurality of copper bumps within first opening slots, said copper bump comprises a first top surface and a first ring surface; removing the first photoresist layer; forming a second photoresist layer on titanium-containing metal layer; patterning the second photoresist layer to form a plurality of second opening slots; forming a plurality of bump isolation layers at spaces, the first top surfaces and the first ring surfaces; forming a plurality of connective layers on bump isolation layers; removing the second photoresist layer, removing the second areas to form an under bump metallurgy layer.

8 Claims, 6 Drawing Sheets

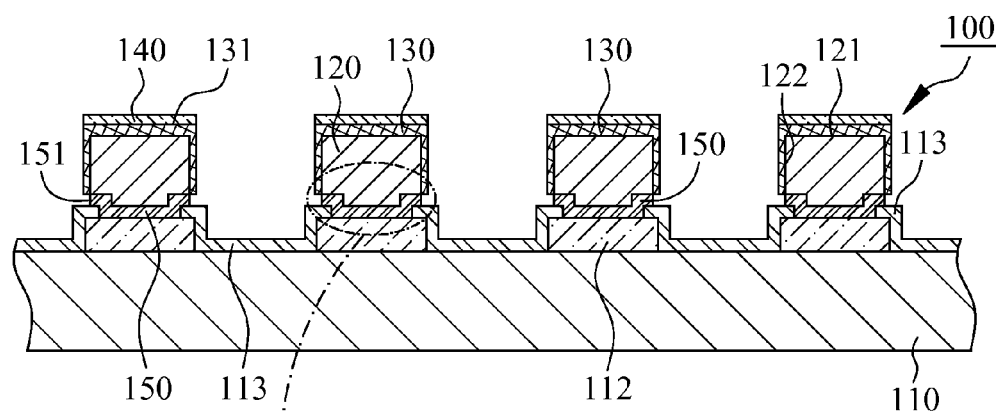
FIG. 2L
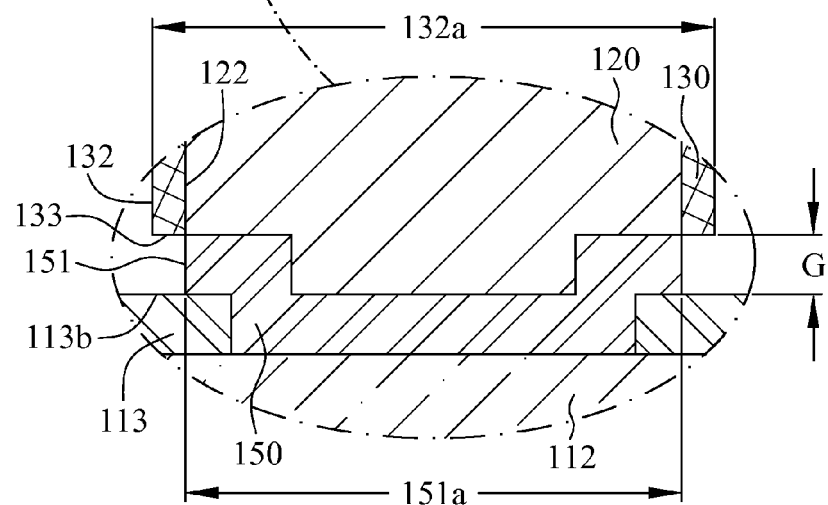

BUMPING PROCESS AND STRUCTURE THEREOF

FIELD OF THE INVENTION

The present invention is generally related to a bumping process and structure thereof, which particularly relates to the bumping process which improves manufacturing yield.

BACKGROUND OF THE INVENTION

Modern electronic products gradually lead a direction of light, thin, short, and small. Accordingly, the layout density of interior circuit for electronic product becomes more concentrated consequentially. However, a short distance between two adjacent electronic connection devices makes a short phenomenon easily occurred in circuit layout.

SUMMARY

The primary object of the present invention is to provide a bumping process comprising the steps of providing a silicon substrate having a surface, a plurality of bond pads disposed on said surface, and a protective layer disposed on said surface, wherein the protective layer comprises a plurality of openings, and the bond pads are revealed by the openings; forming a titanium-containing metal layer on the silicon substrate, said titanium-containing metal layer covers the protective layer and the bond pads and comprises a plurality of first areas and a plurality of second areas located outside the first areas; forming a first photoresist layer on the titanium-containing metal layer; patterning the first photoresist layer to form a plurality of first opening slots, wherein each of the first opening slots is corresponded to each of the first areas of the titanium-containing metal layer; forming a plurality of copper bumps within the first opening slots, each of the copper bumps comprises a first top surface and a first ring surface; removing the first photoresist layer to reveal the first top surfaces of the copper bumps, the first ring surfaces, and the second areas of the titanium-containing metal layer; forming a second photoresist layer on the titanium-containing metal layer and covering the copper bumps with the second photoresist layer; patterning the second photoresist layer to form a plurality of second opening slots, wherein each of the second opening slots is corresponded to each of the copper bumps and comprises an inner lateral surface, and a space located between the inner lateral surface of each of the second opening slots and the first ring surface of each of the copper bumps; forming a plurality of bump isolation layers at the spaces, the first top surfaces and the first ring surfaces, and each of the bump isolation layers comprises a second top surface; forming a plurality of connective layers on the second top surfaces of the bump isolation layers; removing the second photoresist layer; removing the second areas of the titanium-containing metal layer and enabling each of the first areas of the titanium-containing metal layer to form an under bump metallurgy layer located beneath the copper bump. Owning to the reason that each of the bump isolation layers covers the first ring surface and the first top surface of each of the copper bumps, a short phenomenon occurred between two adjacent copper bumps via dissociation of copper ions can be prevented. Therefore, the distance between two adjacent copper bumps can be reduced so as to increase the circuit layout density.

DESCRIPTION OF THE DRAWINGS

FIGS. 2A to 2L are section diagrams illustrating the bumping process in accordance with a preferred embodiment of the present invention.

DETAILED DESCRIPTION OF THE INVENTION

Figure 1:
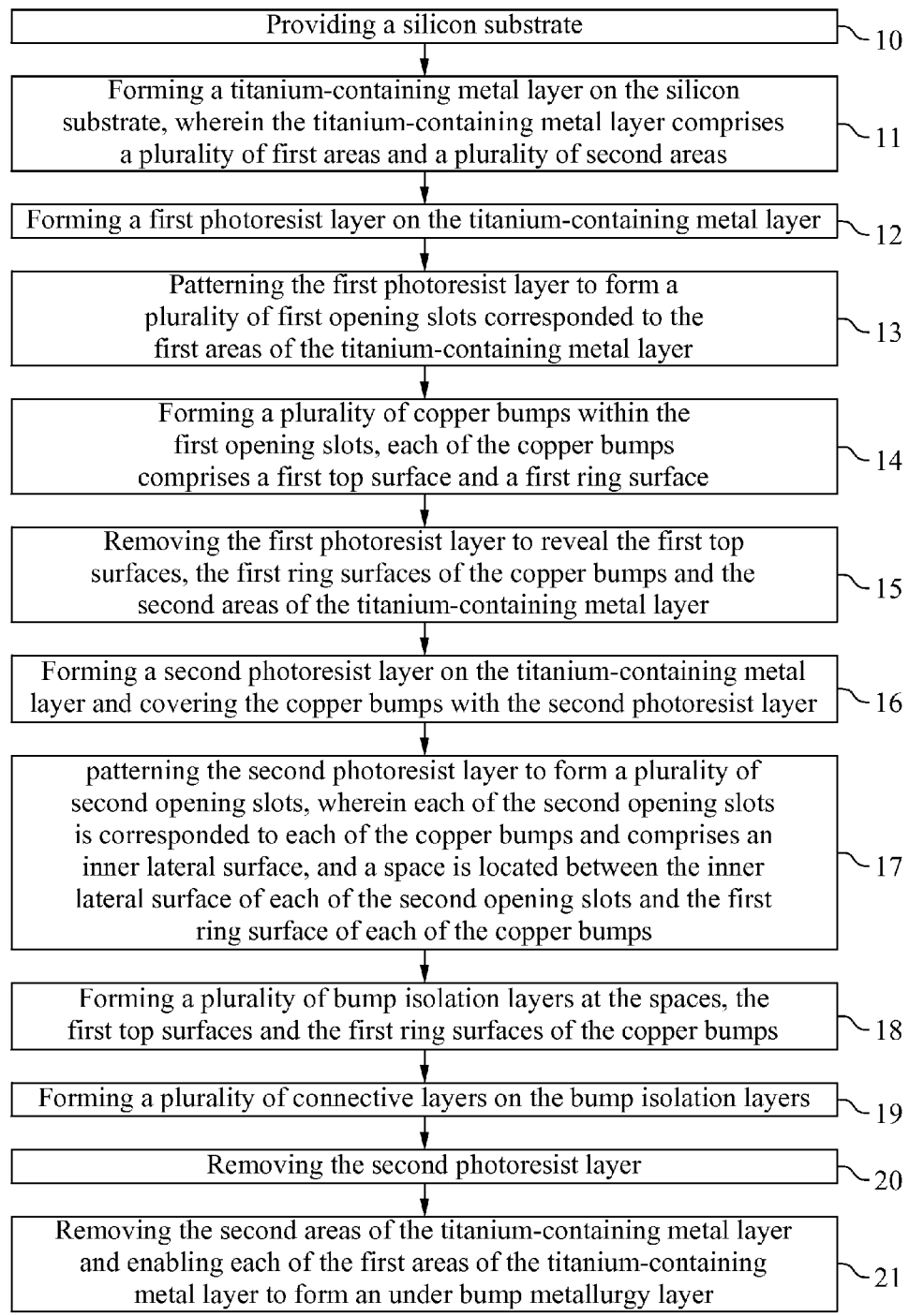
FIG. 1 is a manufacturing flow illustrating a bumping process in accordance with a preferred embodiment of the present invention.

With reference to FIGS. 1 and 2A-2L, a bumping process in accordance with a preferred embodiment of the present invention comprises the steps described as followed. First, referring to step 10 of FIG. 1 and FIG. 2A, providing a silicon substrate 110 having a surface 111, a plurality of bond pads 112 disposed on said surface 111, and a protective layer 113 disposed on said surface 111, wherein the protective layer 113 comprises a plurality of openings 113a, and the bond pads 112 are revealed by the openings 113a. Next, with reference to step 11 of FIG. 1 and FIG. 2B, forming a titanium-containing metal layer 200 on the silicon substrate 110, said titanium-containing metal layer 200 covers the protective layer 113 and the bond pads 112, and said titanium-containing metal layer 200 comprises a plurality of first areas 210 and a plurality of second areas 220 located outside the first areas 210. Thereafter, referring to step 12 of FIG. 1 and FIG. 2C, forming a first photoresist layer 300 on the titanium-containing metal layer 200. Then, referring to step 13 of FIG. 1 and FIG. 2D, patterning the first photoresist layer 300 to form a plurality of first opening slots 310, wherein each of the first opening slots 310 is corresponded to each of the first areas 210 of the titanium-containing metal layer 200. Afterwards, with reference to step 14 of FIG. 1 and FIG. 2E, forming a plurality of copper bumps 120 within the first opening slots 310, each of the copper bumps 120 comprises a first top surface 121 and a first ring surface 122. Then, with reference to step 15 of FIG. 1 and FIG. 2F, removing the first photoresist layer 300 to reveal the first top surfaces 121, the first ring surface 122 of the copper bumps 120 and the second areas 220 of the titanium-containing metal layer 200. Next, with reference to step 16 of FIG. 1 and FIG. 2G, forming a second photoresist layer 400 on the titanium-containing metal layer 200 and covering the copper bumps 120 with the second photoresist layer 400.

Figure 2A:
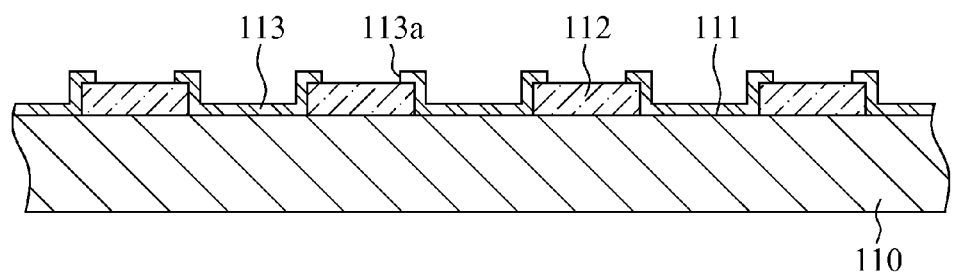
Figure 2B:
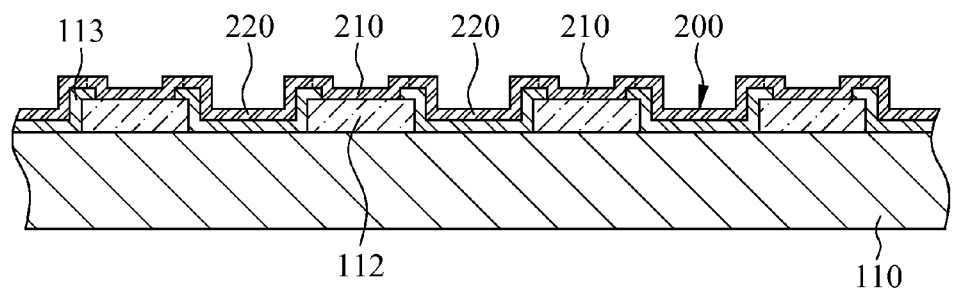
Figure 2C:
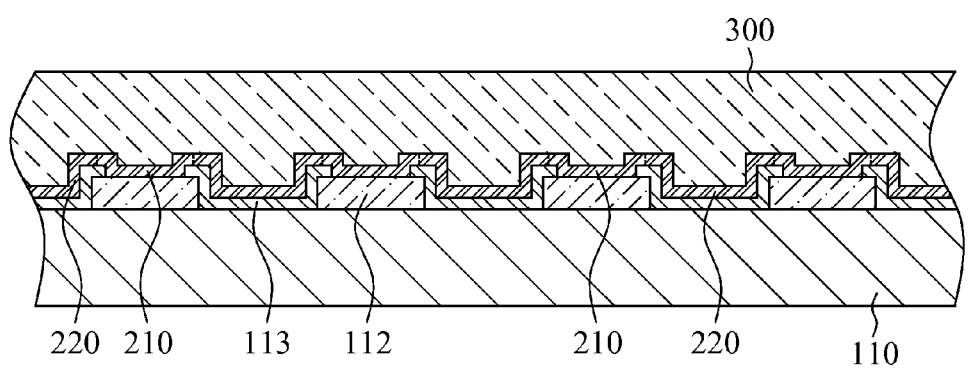
Figure 2D:
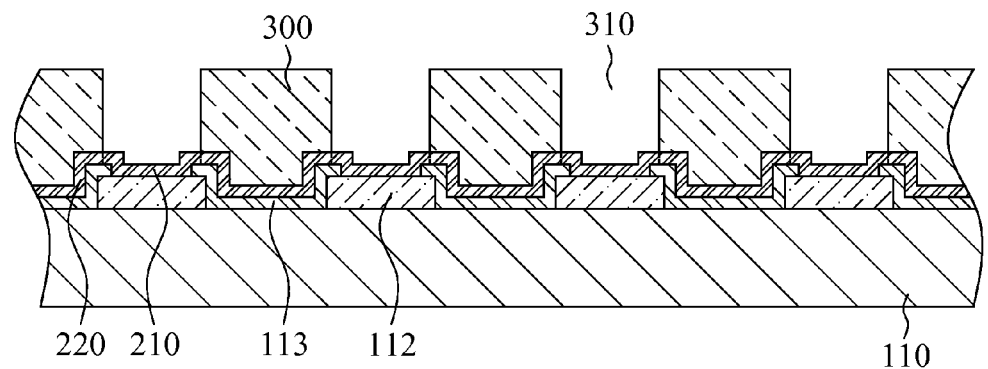
Figure 2E:
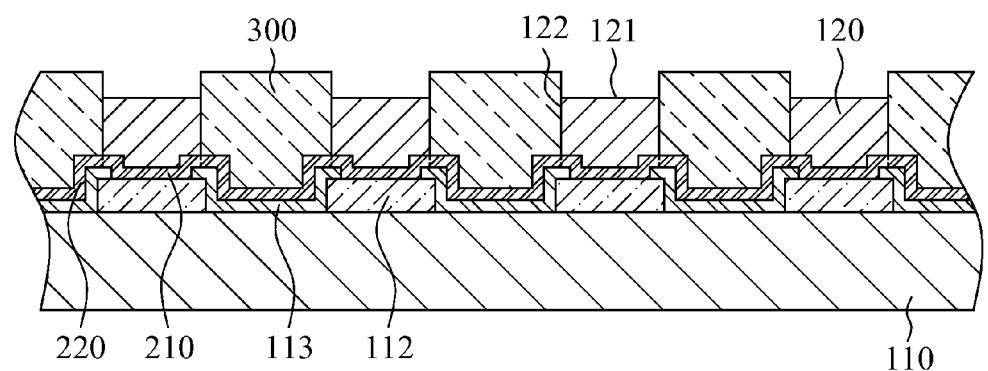
Figure 2F:
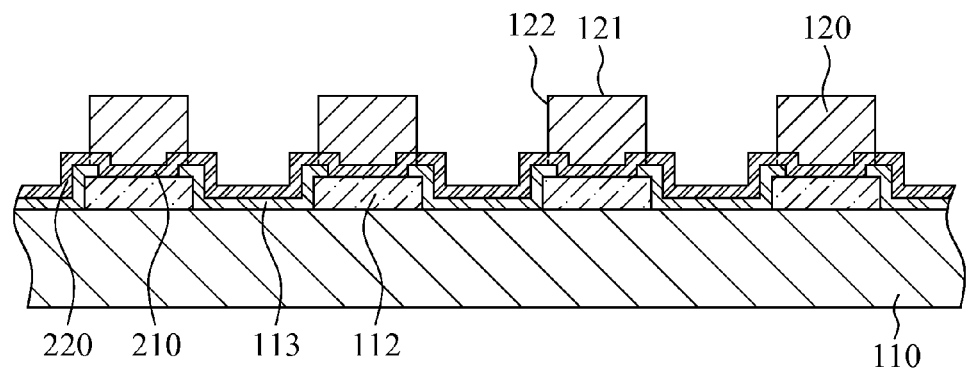
Figure 2G:
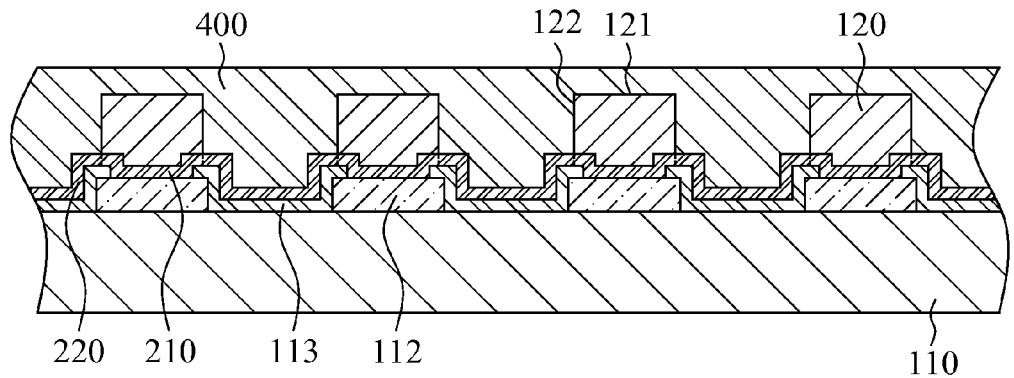
Figure 2H:
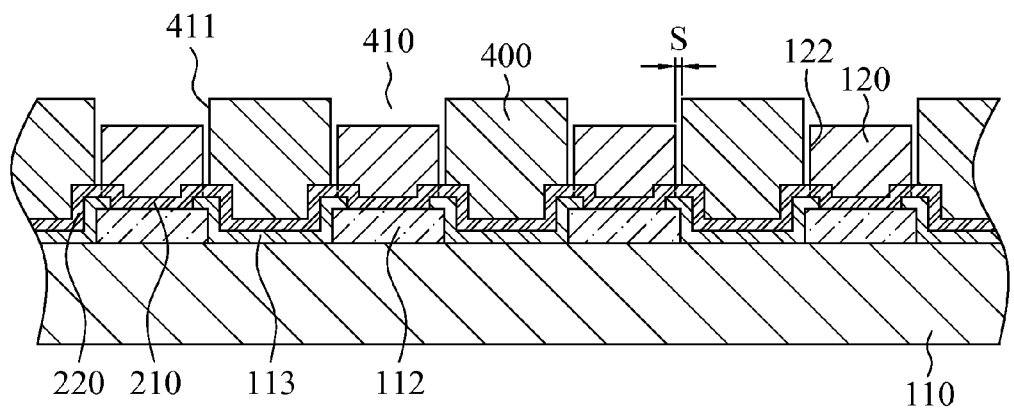
Figure 2I:
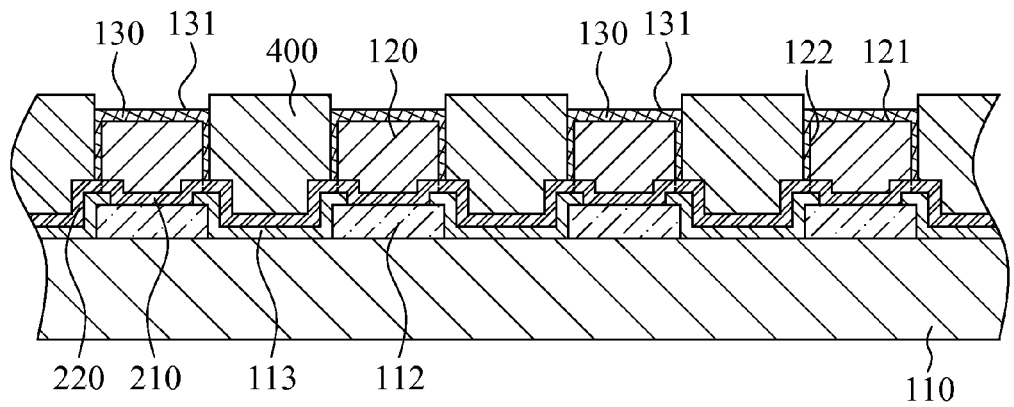
Figure 2J:
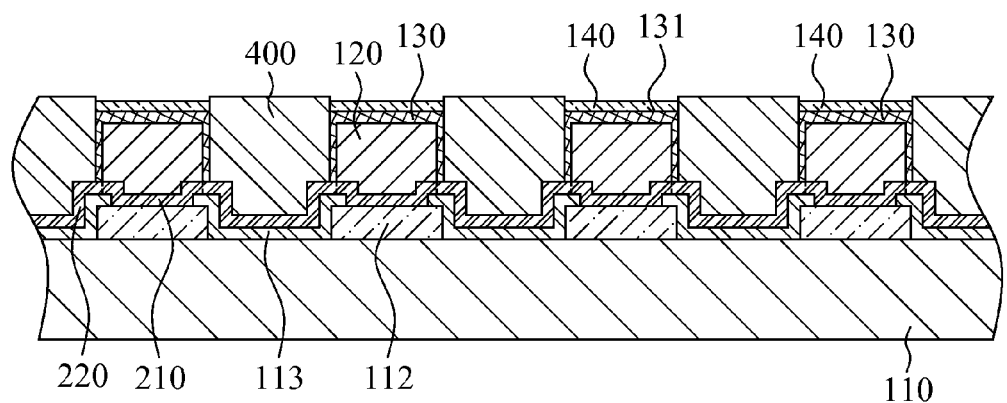
Figure 2K:
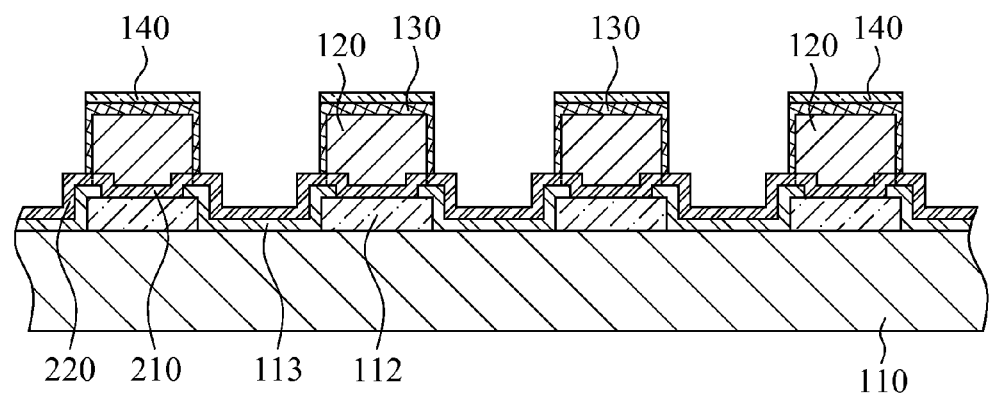

Next, with reference to step 17 of FIG. 1 and FIG. 2H, patterning the second photoresist layer 400 to form a plurality of second opening slots 410, wherein each of the second opening slots 410 is corresponded to each of the copper bumps 120 and comprises an inner lateral surface 411, and a space S is located between the inner lateral surface 411 of each of the second opening slots 410 and the first ring surface 122 of each of the copper bumps 120. Then, referring to step 18 of FIG. 1 and FIG. 2I, forming a plurality of bump isolation layers 130 at the spaces S, the first top surfaces 121 and the first ring surfaces 122 of each of the copper bumps 120, wherein the bump isolation layer 130 comprises a second top surface 131. In this embodiment, the material of the bump isolation layers 130 can be chosen from one of nickel, palladium, gold or alloy of mentioned metals. Thereafter, referring to step 19 of FIG. 1 and FIG. 2J, forming a plurality of connective layers 140 on the second top surfaces 131 of the bump isolation layers 130. In this embodiment, the material of the connective layers 140 can be gold. Then, referring to step 20 of FIG. 1 and FIG. 2K, step 20 describes removing the second photoresist layer 400. Eventually, with reference to step 21 of FIG. 1 and FIG. 2L, removing the second areas 220 of the titanium-containing metal layer 200 and enabling each of the first areas 210 of the titanium-containing metal layer 200 to form an under bump metallurgy layer 150 located beneath the copper bump 120. The material of the under bump metallurgy layer 150 can be selected from one of titanium/tungsten/gold, titanium/copper or titanium/tungsten/copper.

In this embodiment, each of the under bump metallurgy layers 150 comprises a second ring surface 151 having a first outer circumference 151a, each of the bump isolation layers 130 comprises a third ring surface 132 having a second outer circumference 132a, and the second outer circumference 132a is not smaller than the first outer circumference 151a. Besides, the second ring surface 151 of each of the under bump metallurgy layers 150 and the first ring surface 122 of each of the copper bumps 120 are coplanar. In addition, the protective layer 113 further comprises an exposing surface 113b, each of the bump isolation layers 130 further comprises a bottom surface 133, and an interval G is located between the exposing surface 113b and the bottom surface 133. Owning to the reason that each of the bump isolation layers 130 covers the first ring surface 122 and the first top surface 121 of each of the copper bumps 120, a short phenomenon occurred between two adjacent copper bumps 120 via dissociation of copper ions can be prevented. Therefore, the distance between two adjacent copper bumps 120 can be effectively reduced so as to increase circuit layout density.

Referring to FIG. 2L again, a bump structure 100 in accordance with a preferred embodiment at least includes a silicon substrate 110, a plurality of under bump metallurgy layers 150, a plurality of copper bumps 120, a plurality of bump isolation layers 130, and a plurality of connective layers 140. The silicon substrate 110 comprises a surface 111, a plurality of bond pads 112 disposed on the surface 111, and a protective layer 113 disposed on the surface 111, wherein the protective layer 113 comprises a plurality of openings 113a and an exposing surface 113b, and the bond pads 112 are revealed by the openings 113a. The under bump metallurgy layers 150 are formed on the bond pads 112, and the material of the under bump metallurgy layers 150 can be chosen from titanium/tungsten/gold, titanium/copper or titanium/tungsten/copper. Each of the copper bumps 120 is formed on each of the under bump metallurgy layers 150 and comprises a first top surface 121 and a first ring surface 122. In this embodiment, each of the under bump metallurgy layers 150 comprises a second ring surface 151 having a first outer circumference 151 a, wherein the second ring surface 151 of each of the under bump metallurgy layers 150 and the first ring surface 122 of each of the copper bumps 120 are coplanar. The bump isolation layer 130 covers the first top surface 121 and the first ring wall 122 of each of the copper bump 120. Each of the bump isolation layers 130 comprises a second top surface 131, a third ring surface 132 and a bottom surface 133. The third ring surface 132 comprises a second outer circumference 132a, and the second outer circumference 132a is not smaller than the first outer circumference 151a of the second ring surface 151. An interval G is located between the exposing surface 113b of the protective layer 113 and the bottom surface 133 of each of the bump isolation layer 130. In this embodiment, the material of the bump isolation layers 130 can be chosen from one of nickel, palladium, gold or alloy of mentioned metals. The connective layers 140 are formed on the second top surfaces 131 of the bump isolation layers 130, and the material of the connective layers 140 can be gold.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A bumping process at least comprising:
   providing a silicon substrate having a surface, a plurality of bond pads disposed on said surface, and a protective layer disposed on said surface, wherein the protective layer comprises a plurality of openings, and the bond pads are revealed by the openings;
   forming a titanium-containing metal layer on the silicon substrate, said titanium-containing metal layer covers the protective layer and the bond pads, and said titanium-containing metal layer comprises a plurality of first areas and a plurality of second areas located outside the first areas;
   forming a first photoresist layer on the titanium-containing metal layer;
   patterning the first photoresist layer to form a plurality of first opening slots, wherein each of the first opening slots is corresponded to each of the first areas of the titanium-containing metal layer;
   forming a plurality of copper bumps within the first opening slots, wherein each of the copper bumps comprises a first top surface and a first ring surface;
   removing the first photoresist layer to reveal the first top surfaces of the copper bumps, the first ring surfaces, and the second areas of the titanium-containing metal layer;
   forming a second photoresist layer on the titanium-containing metal layer and covering the copper bumps with the second photoresist layer;
   patterning the second photoresist layer to form a plurality of second opening slots, wherein each of the second opening slots is corresponded to each of the copper bumps and comprises an inner lateral surface, and a space located between the inner lateral surface of each of the second opening slots and the first ring surface of each of the copper bumps;
   forming a plurality of bump isolation layers at the spaces, the first top surfaces and the first ring surfaces of each of the copper bumps, and each of the bump isolation layers comprises a second top surface;
   forming a plurality of connective layers on the second top surfaces of the bump isolation layers;
   removing the second photoresist layer; and
   removing the second areas of the titanium-containing metal layer and enabling each of the first areas of the titanium-containing metal layer to form an under bump metallurgy layer located beneath the copper bump.

2. The bumping process in accordance with claim 1, wherein the protective layer further comprises an exposing surface, each of the bump isolation layers further comprises a bottom surface, and an interval is located between the exposing surface and the bottom surface.

3. The bumping process in accordance with claim 1, wherein each of the under bump metallurgy layers comprises a second ring surface having a first outer circumference, each of the bump isolation layers comprises a third ring surface having a second outer circumference, and the second outer circumference is not smaller than the first outer circumference.

4. The bumping process in accordance with claim 1, wherein each of the under bump metallurgy layers comprises a second ring surface, each of the first ring surfaces and each of the second ring surfaces are coplanar.

5. The bumping process in accordance with claim 3, wherein each of the under bump metallurgy layers comprises a second ring surface, each of the first ring surfaces and each of the second ring surfaces are coplanar.

6. The bumping process in accordance with claim 1, wherein the material of the under bump metallurgy layers can be selected from one of titanium/tungsten/gold, titanium/copper or titanium/tungsten/copper.

7. The bumping process in accordance with claim 1, wherein the material of the connective layers can be gold.

8. The bumping process in accordance with claim 1, wherein the material of the bump isolation layers can be chosen from one of nickel, palladium, gold or alloy of mentioned metals.

* * * * *